United States Patent
Filci et al.

(10) Patent No.: US 11,131,731 B2
(45) Date of Patent: Sep. 28, 2021

(54) MULTI-CHANNEL INTEGRATED MRI TRANSMITTER SYSTEM FOR A MAGNETIC RESONANCE IMAGING DEVICE

(71) Applicant: ASELSAN ELEKTRONIK SANAYI VE TICARET ANONIM SIRKETI, Ankara (TR)

(72) Inventors: Filiz Ece Filci, Ankara (TR); Aylin Doğan, Ankara (TR); Gökhan Cansiz, Ankara (TR); Ali Demirci, Ankara (TR); Volkan Açikel, Ankara (TR); Bülent Şen, Ankara (TR); Ergin Atalar, Ankara (TR)

(*) Notice: Subject to any disclaimer, the term of this patent is extended or adjusted under 35 U.S.C. 154(b) by 0 days.

(21) Appl. No.: 16/758,175

(22) PCT Filed: Jan. 7, 2019

(86) PCT No.: PCT/TR2019/050010
§ 371 (c)(1),
(2) Date: Apr. 22, 2020

(87) PCT Pub. No.: WO2019/240703
PCT Pub. Date: Dec. 19, 2019

(65) Prior Publication Data
US 2020/0326394 A1 Oct. 15, 2020

(30) Foreign Application Priority Data

Jan. 11, 2018 (TR) .................................. 2018/00406

(51) Int. Cl.
*G01R 33/34* (2006.01)
*G01R 33/36* (2006.01)
(Continued)

(52) U.S. Cl.
CPC ..... *G01R 33/34092* (2013.01); *G01R 33/3614* (2013.01); *G01R 33/3621* (2013.01); *G01R 33/543* (2013.01); *G01R 33/5608* (2013.01)

(58) Field of Classification Search
CPC .......... G01R 33/34092; G01R 33/3614; G01R 33/3621; G01R 33/543; G01R 33/5608
See application file for complete search history.

(56) References Cited

U.S. PATENT DOCUMENTS 6,925,322 B2 * 8/2005 Helfer .................... A61B 5/055
600/423
8,324,899 B2 * 12/2012 Hoogeveen ........ G01R 33/3621
324/318

OTHER PUBLICATIONS

"Optically Controlled On-Coil Amplifier with RF Monitoring and Feedback" Gudino et al. Magn. Reson. Med. May 2018; 79(5):2833-2841 (Year: 2018).*

(Continued)

*Primary Examiner* — G. M. A. Hyder

(57) ABSTRACT

A multi-channel RF transmitter system including a magnetic resonance imaging device, a multi-channel RF coil array, a control computer receiving required parameters from a user, producing triggering and clock signals and synthesizing input data required for each channel of RF coil array according to imaging scenario to be realized, an interface control module producing basic band MRI signals according to data from the control computer, a signal modulator and control module for modulating MRI signals produced at the interface control module into radio frequency and distribution to channels, a power/data distribution module distributing the produced signals and required DC power, a RF power amplifier module converting digital signal coming from the power/data distribution module into analog signal, amplifying it and transmitting to members of the coil array, a feedback line for track and correction of any errors in RF (Continued)

signal transmitted to the coil array by the power amplifier module.

9 Claims, 2 Drawing Sheets

(51) Int. Cl.
    *G01R 33/54*     (2006.01)
    *G01R 33/56*     (2006.01)

(56)     References Cited

OTHER PUBLICATIONS

Prototype Hardware of FPGA Controlled Multi-Channel All-Digital RF Transmitter for Parallel Magnetic Resonance Imaging Filci et al. Proc. Intl. Soc. Mag. Reson. Med. 25 (2017). (Year: 2017).*

* cited by examiner

MULTI-CHANNEL INTEGRATED MRI TRANSMITTER SYSTEM FOR A MAGNETIC RESONANCE IMAGING DEVICE

THE RELATED ART

Technical Field

This invention relates to RF transmitter coil systems used to stimulate magnetic spin vectors of hydrogen atoms in body for imaging purposes in magnetic resonance imaging (MRI) devices. The invention discloses a multi-channel, novelty active MRI transmitter coil array which is active electronic modular on the coil instead of single-channel passive coil used in conventional RF transmitter system.

BACKGROUND OF THE INVENTION

The embodiments in the related art use birdcage coil in 1.5 T (Tesla) and 3 T conventional MRI systems as RF transmitter coil. This coil is of cylindrical structure and has two supply channels of 90 degrees angle physically. These two channels are fed by RF signals that having 90 degrees phase between them. MR signals are firstly generated by a signal generator and then are amplified by a single high-power analogue RF power amplifier and carried through the Faraday cage where the MRI device is located, via analogue transmission lines. The amplified MR signal passes through two way 90 degree power divider circuit and reaches the birdcage antenna. In this system, the phase between two channels can not be changed and can not make frequency and amplitude adjustment independent of each other.

In the devices having DC magnetic field bigger than 1.5 T and 3 T, it has been started to use RF transmitter arrays. The purpose in starting to use those transmitter arrays in general is to increase the RF field uniformity inside the tissue. Minimizing RF magnetic field change and maintaining the homogeneity of the RF magnetic field inside the RF coil is critical. Use of coil groups of multi-channel RF transmitters in MRI systems having high DC magnetic fields was started in order to provide homogeneity. In current status, RF transmit array arrays are at stage of emergence into clinic use.

In literature, the transmit arrays can be up to 32 channels and each channel has a RF power amplifier specific to it. This is achieved by means of increasing the number of channels of current RF power amplifiers as desired. To adjust the amplitude, phase and frequency of each channel still requires independent but synchronous signal generators for each channel. Although this can be achieved by increasing the number of signal generators inside the MRI spectrometer MRI signal is amplified outside of the Faraday cage and then carried onto the chamber in analogue way. In literature switching power amplifiers on coils and optical carriage of produced signal from outside of the faraday cage to inside is suggested as solution for such problems. Carrier and envelope signal are carried optically for each channel in such studies and two optic cables are needed per channel.

Problems Solved by the Invention

The invention is designed as alternative to transmit radio frequency (RF) coils, which are used to stimulate the magnetization vector inside the body, used in present MRI devices. One RF power amplifier module having digital input and analog output is located on each component in the provided coil array. RF power amplifier module is the unit which receives RF signal in the form of digitized modulation coming differentially or single terminal from the input and converting it into analogue signal in the module and amplifying it then sending to module output. RF power amplifier module is located on the RF coil. Each RF power amplifier module is fed by DSM (Delta Sigma Modulation) based amplitude, phase and frequency modulated digital signals independently of each other. Therefore, instead of one high power RF power amplifier, RF power amplifiers in the number that equals to number of channels located in distributed architecture are used in new generation MRI RF transmitter systems. In the proposed system, the unit controlling RF power amplifier module is placed inside the Faraday cage too. Thus, the information received from the user is carried into the Faraday cage via one fiber optic cable in digital format. Using the information obtained from the user about the signal to be generated, the signal modulator, which is located in the Faraday cage, generates the MRI signal required for each channel and distributes to the RF power amplifier modules, which are located on the coil array. Output amplitude, phase and frequency information of the digital RF power amplifier modules can be controlled, and their values can be changed independent of each other and in digital format. In addition, RF signals applied to coils by each RF power amplifier module and reflections from the coil array elements are transferred to the analog to digital converter (ADC) via couplers located inside of the each module for patient safety and error control. They are transmitted outside of the Faraday cage again optically.

Another characteristic of the invention is that it can dynamically measure active S-parameters of the coil array by help of embodiment capable to measure transmitted and reflected signals at input of each coil element. S-parameters vary depending on patient entering at coil array. Such changes in s-parameters require correction of voltage to be applied to each element in the coil array each time. In the suggested system, following s-parameter measurement to be made for each patient, required corrections can be made on signals that will be applied to coil elements to obtain the desired currents. In addition, the applied RF signal to the coil array elements and the signal reflected back from each array element are measured by use of couplers, and analog to digital conversion is conducted, and safety scanning can be made.

The most important difference of the invention from present embodiments is the minimization of the interference effects occurring because of the RF coupling between multiple RF cables, one for each channel, that carries the high RF power from the amplifiers into the Faraday cage. Beside this, elimination of the RF cabling from outside into the Faraday cage any RF noise leakage to the Faraday cage will be reduced. Several channels can be controlled by means of one single fiber optic line thanks to carrying signal generator modulators into the chamber, where the MRI system is located. Full digitalization of the system contributes a high programmable flexibility to the system. One single RF pulse can be modulated by carrier signal of more than one different frequency by use of delta sigma modulation, which provides speeding up through multiple slice selection by one single pulse during MRI scan. It also provides cost effectiveness by use of digital RF power amplifiers of lower power and located in distributed architecture instead of high cost and high output power single analogue RF power amplifier in conventional systems, and it is also capable to work at adequate performance in case of power amplifier failure.

DETAILED DESCRIPTION OF THE INVENTION

In order to achieve the purpose of the invention, multi-channel RF transmitter coil chain system for a magnetic resonance imaging device is shown in the attached figures, which are:

FIG. 1 is a schematic view of RF transmitter system for magnetic resonance imaging device.

FIG. 2 is a schematic view of internal structure of RF power amplifier module.

The parts indicated in the figures have been designated separate numbers and said numbers are given below:
1. Multi-channel RF transmitter system
2. Magnetic resonance imaging device
3. Coil array
4. Control device
   4.1. Interface control computer
   4.2. MRI control computer
5. Interface control module
6. Signal modulator and control module
7. Fibre optic line
8. Power/data distribution module
9. RF driver module
10. Power amplifier module
    10.1. Power amplifier block
    10.2. Coupler
       10.2.1. Transmitted Power measurement channel
       10.2.2. Returning Power measurement channel
11. Feedback line
    11.1. RF switching module
    11.2. demodulator module
12. Power supply
F. Faraday cage
N. Object to be imaged A multi-channel RF transmitter system (1) for a magnetic resonance imaging device (2) basically consists of
- a multi-channel RF coil array (3) having N pieces of members, located inside a magnetic resonance imaging device (2),
- a control device (4) providing control of magnetic resonance imaging device (2) by user, having a data input interface for receiving required system parameters from the user, and adapted for synthesizing input data required for each channel of RF coil (3) array selected by user or an algorithm depending on imaging scenario to be realized and generation of trigger and clock signals required for simultaneous working of all units of the magnetic resonance imaging device (2)
- an interface control module (5) adapted to generate base band MRI signal sequence according to imaging scenario produced by user in control device (4),
- a signal modulator and control module (6) using trigger and clock signals from control device (4) synchronously working with magnetic resonance imaging device (2), taking basic band MRI signal sequence generated at interface control module (5), adapted for increasing it to a predetermined RF carrier frequency by means of digital modulation method and transmission of this digital RF modulation signal to RF coil channels,
- A fiber optic line (7) providing transfer of signals to be transmitted from interface control module (5) to signal modulator and control module (6),
- a Power/data distribution module (8) buffering digital RF modulation MRI signal sequence generated by signal modulator and control module (6) and transmitting to RF power amplifier module (10) via a RF driver module (9) through RF coil chain (3) and filtering DC power required for this RF power amplifier module (10) on RF coil chain (3),
- A RF power amplifier module (10) converting digital RF modulated MRI signal sequence having desired modulation, phase and amplitude coming from power/data distribution module (8) into analogue signal by use of a filter, and using a dynamic envelope modulator to increase power efficiency and thus amplifying MRI signal sequence, transmitting analogue MRI signal amplified efficiently to elements of RF coil array (3), integrated with coil array (3) and consisting of power amplifier block (10.1) in number equal to number of channels of coil array (3),
- A RF driver module (9) driving a RF power amplifier module (10) after raising signal level at input of RF power amplifier module (10) to required power level,
- A RF coupler (10.2) located at output of each RF power amplifier block (10.1) and sending the power both transmitted to each coil array element upon amplifying and power returning from each coil array element to analogue to digital converters at demodulator module (11.2) via return feeding line,
- A feedback line (11) consisting of a RF switching module (11.1) selecting channels of which data will be read for track and correction of errors that might occur in RF signal transmitted to coil array (3) by power amplifier module (10), and a demodulator module (11.2) converting the signals received from selected channels to base band by an analogue to digital converter and sending them to signal modulator and control module (6),
- A power supply (12) providing the power to be distributed by power/data distribution module (8).

BRIEF DESCRIPTION OF THE DRAWINGS

FIG. 1 shows a block diagram of novel system consisting of multi-channel RF transmitter equipment located onto RF coil array (3) for magnetic resonance imaging device (2). This system contains a magnetic resonance imaging device (2) and a signal modulator and control module (6) in a faraday cage (F). Aforementioned magnetic resonance imaging device (2) consists of a multi-channel RF coil array (3) a power amplifier module (10) integrated with the coil array (3), a RF driver module (9) connected to power amplifier module (10), power/data distribution module (8) connected to signal modulator and control module (6) and feedback line (11) connected to power amplifier module (10) by signal modulator and control module (6). Outside of aforementioned faraday cage (F), there are an interface control module (5) connected to signal modulator and control module (6), a control device (4) connected to interface control module (5) and a power supply (12) connected to power/data distribution module (8).

Figure 1:
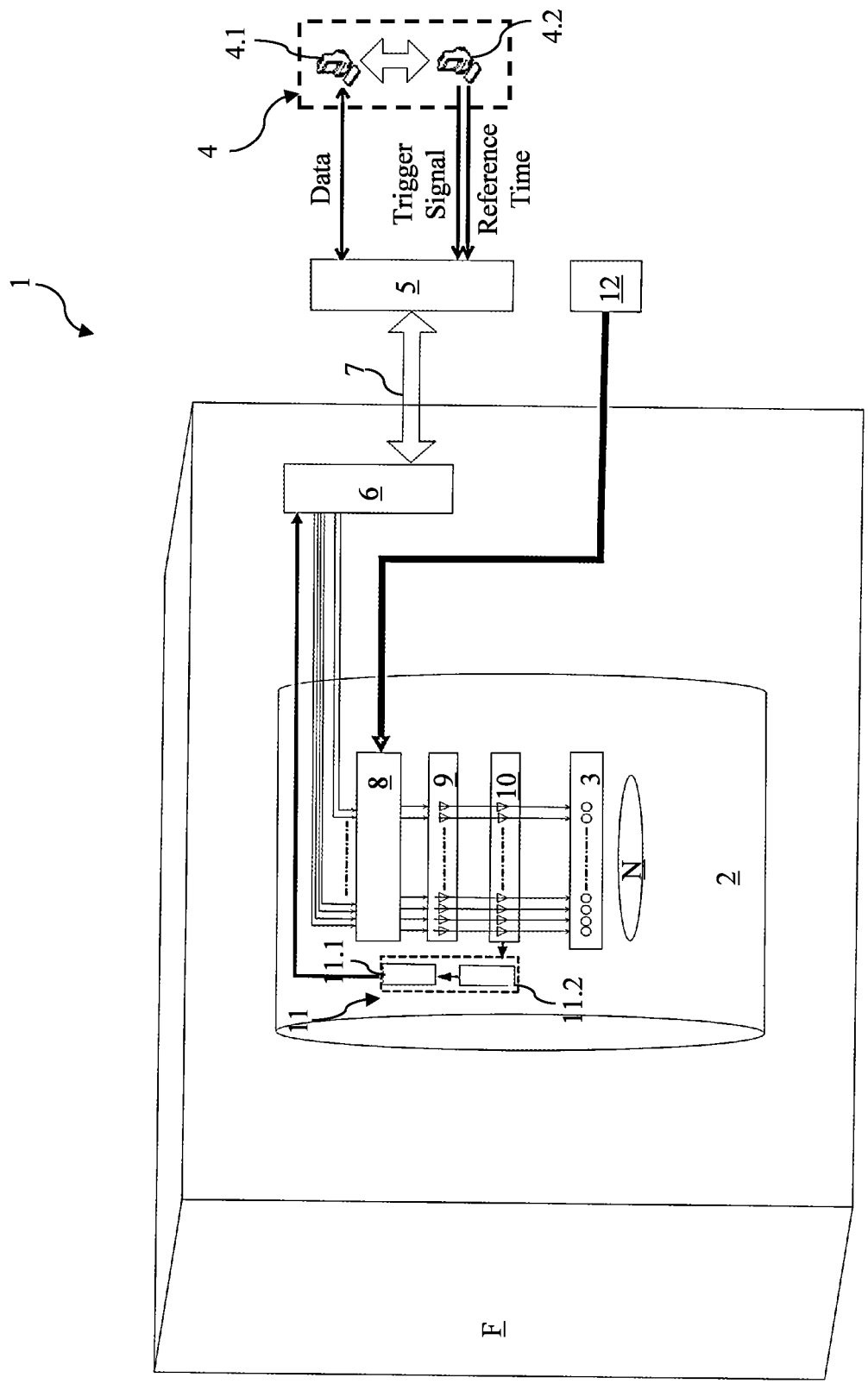
FIG. 1 is a block diagram of the multi-channel RF transmitter equipment located onto an RF coil array for a magnetic resonance imagine device.
Figure 2:
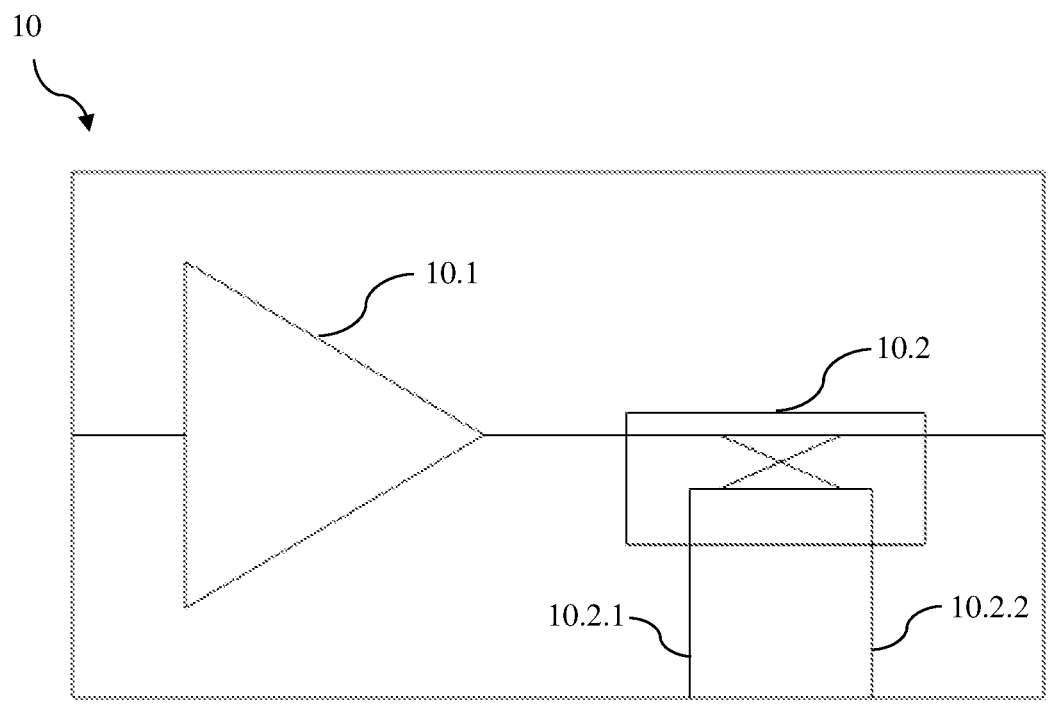
FIG. 2 is a schematic diagram of a power amplifier block as used in the system of the present invention.

In a preferred embodiment of the invention, each member of multi-channel coil array (3) developed for magnetic resonance imaging device (2) has a RF power amplifier block (10.1) with digital input and analog output. Aforementioned each RF power amplifier block (10.1) in power amplifier module (10) can be driven by DSM based amplitude, phase and frequency modulated digital signals independent of each other. RF signals intended to be sent to RF coil array (3) come to power amplifier module (10) in digital form and the digitally modulated signal is converted to analog RF signal by power amplifier module (10) and amplified and is sent to elements of RF coil array (3) via transmitted power measurement channel (10.2.1). Since coils used in magnetic resonance imaging device (2) are narrow band having high Q factor, they recover Signal Noise Rate of output signal.

Trigger and clock signals are required for synchronization of new multi-channel RF transmitter system (1) with magnetic resonance imaging device (2) are transmitted from control device (4) to signal modulator and control module (6). System parameters (for instance selection of channels, phase, amplitude, frequency of selected channels and RF pulse envelope form details etc. inter-channel settings entered by user) determined by use of a data input interface (for instance, mouse, keyboard and/or touch screen . . . ) on control device (4) by user from interface control module (5) are collected and sent to interface control module (5) firstly; then the formed base band MRI signal according to the received information transferred to signal modulator and control module (6) via fiber optic lines (7). Signal modulator and control module (6) modulates modulation, amplitude, phase, frequency and pulse envelope form data coming from interface control module (5) into radio frequency and produces signal to be applied to each channel and transmits to power/data distribution module (8). Power/data distribution module (8) buffers the coming digital signals and distributes to related RF driver module (9). Power amplifier module (10) driven by RF driver module (9) sends the signal carrying the desired modulation, phase and amplitude values to coil array (3) elements and forms required stimulation distribution in the area to be imaged in this way.

While the above operations are ongoing, MRG signals which are obtained via couplers, which are located at the output of each RF power amplifier modules (10), are processed by signal modulator and control module (6) and are transmitted to control computer (4) for controlling patient safety during MRI as well as track-correction of errors that might occur in given MRI signal. Control computer (4) estimates the S-parameters of coil array (3) in line with the coming data and may produce signal for generation of desired current on members of the coil array (3).

In an embodiment of the invention, control device (4) is designed as a single computer. In another embodiment of the invention, aforementioned control device (4) consists of MRI control computers (4.2) consisting of an interface control computer (4.1) instead of a single computer and MRI control computer (4.2) used in present magnetic resonance imaging devices (2) connected to this interface control computer (4.1). In this embodiment of the invention, MRI control computer (4.2) is a unit having a data input interface producing triggering and clock signals required for simultaneous operation of all units of the magnetic resonance imaging device (2). Interface control computer (4.1) is the unit having a data interface for connection to a data input interface, MRI control computer (4.2) for receipt of required system from user, synthesizing input data required for each channel of RF coil array (3) by user or an algorithm according to imaging scenario to be realized, in other words, separately programming each coil channel.

The invention claimed is:

1. A multi-channel RF transmitter system for a magnetic resonance imagine device, the multi-channel RF transmitter system comprising:

a control device having a data input interface for receiving required system parameters from a user, said control device adapted to synthesize input data required for each channel of an RF coil array selected by the user or an algorithm depending on an imaging scenario to be realized, said control device generating trigger and clock signals required for simultaneous operation of all units of the magnetic resonance imaging device;

an interface control module adapted to generate a basic band MRI signal sequence according to the imaging scenario selected by the user in said control device;

a signal modulator and control module using the trigger and clock signals from said control device, said signal modulator and control module adapted to operate synchronously with the magnetic resonance imaging device so as to take the basic band MRI signal sequence generated at said interface control module and to increase the basic band MRI signal sequence to a predetermined RF carrier frequency by digital modulation, said signal modulator and control module transmitting the digitally modulated RF carrier frequency to the channels of the RF coil array;

a fiberoptic line transferring signals transmitted from said interface control module to said signal modulator and control module;

a power/data distribution module buffering the digitally RF modulated MRI signal sequence generated by said signal modulator and control module and transmitting the buffered digitally RF modulated MRI signal sequence to an RF power amplifier via an RF driver module through the RF coil array and filtering DC power required by the RF power amplifier module, the RF power amplifier module converting the digitally RF modulated MRI signal sequence into an analog signal, the digitally RF modulated MRI signal sequence having a desired modulation and a desired phase and a desired amplitude from said power/data distribution module, the RF power amplifier amplifying and transmitting the analog signal to members integrated int the coil array, the RF power amplifier comprising power amplifier blocks, the power amplifier bocks being equal in number to a number of channels of the coil array, the RF driver module driving the RF power amplifier module after raising a signal level at an input of the RF power amplifier module to a required power level;

a feedback line having a an RF switching module that selects channels of which data is read for track and correction of errors occurring in the RF signal transmitted to the coil array by the power amplifier module;

a demodulator module that minimizes signals received from the selected channels to basic band and sending the minimized signals to said signal modulator and control module; and a power supply providing power to be distributed by said power/data distribution module.

2. The multi-channel RF transmitter system of claim 1, the coil array having a digital input and an analog output.

3. The multi-channel RF transmitter system of claim 2, wherein the power amplifier blocks are driven by DSM-based amplitude, phase and frequency modulation signals independent of each other.

4. The multi-channel RF transmitter system of claim 1, wherein the data input interface of said control device is a mouse.

5. The multi-channel RF transmitter system of claim 1, wherein the data input interface of said control device is a keyboard.

6. The multi-channel RF transmitter system of claim 1, wherein the data input interface of said control device is a touch screen.

7. The multi-channel RF transmitter system of claim 1, wherein the data input interface of said control device is adapted to select the channel of the coil array and provide input phase, amplitude, frequency and RF pulse envelope from data of the selected channel.

8. The multi-channel RF transmitter system of claim 1, further comprising:
   an RF coupler located at an output of each of the RF power amplifier modules so as to send both power transmitted to each of the members of the coil array and power returning from each of the members of the coil array to analog signal converters said demodulator module via a return feeding line.

9. The multi-channel RF transmitter system of claim 1, wherein signal modulator and control module is adapted to receive and process an MRI signal sample received by said feedback line by the RF coupler.

\* \* \* \* \*